United States Patent Office 2,947,064

Patented Aug. 2, 1960

2,947,064

METHOD OF INTERCONNECTING PATHWAY PATTERNS OF PRINTED CIRCUIT PRODUCTS BY CHEMICAL DEPOSITION

John B. Langton, Tarrytown, N.Y., assignor to Technograph Printed Electronics Inc., Tarrytown, N.Y.

No Drawing. Filed Mar. 6, 1956, Ser. No. 569,674

6 Claims. (Cl. 29—155.5)

This invention relates to printed circuit products of the kind involving a conductive pathway pattern adherent to opposite sides of insulation backing. More particularly, it is directed to metallic junctions by means of holes between the two pathway patterns for electrically interconnecting same, and especially to a method of metallizing the walls defining said holes by chemical deposition.

In printed circuit products of the kind here involved, the interconnections of the pathway patterns on the two sides of the insulation material are customarily effected through one or several holes through the insulation backing. The thickness of the backing may and does vary within wide limits. In actual practice, it varies between paper thin insulation sheets and solid blocks of insulation material whereas the conductive pattern is always thin, usually in the order of foil thickness, even when reinforced by the deposition of metal. The use of a thin conductive pattern is one of the inherent characteristics of printed circuit products produced by any of the techniques now known.

The pending application of Hubert L. Shortt and John B. Langton, Serial No. 487,916, filed February 14, 1955, describes methods of interconnecting the pathway patterns of printed circuit products wherein the wall surfaces defining the holes are metal plated, as by electrodeposition. Said application shows how the wall surfaces defining the holes may be rendered electrically conductive, inter alia, by chemical deposition of a metal film.

The instant invention is directed especially to improvements in the method of effectuating the chemical deposition of a metal film on the wall surfaces defining such holes. Accordingly, this invention provides an improvement in chemical deposition which is suitable and appropriate in carrying out the inventions of said applications, Ser. No. 487,916.

Accordingly, it is among the principal objects of this invention to provide a novel means of chemically depositing a metal film on the walls defining the holes in printed circuit products of the class herein above mentioned.

A further object of this invention is to provide means for chemically depositing a film of metallic copper on the walls defining the holes in printed circuit products of the class aforesaid.

A still further object of this invention is to provide means for rendering the walls of the holes in printed circuit products of the class aforesaid receptive to the deposition thereof of electrodeposited metal.

A still further object of this invention is to provide a novel method of coating the walls defining the holes in the printed circuit products of the class aforesaid with a coating of copper that is also bonded to the conductive pathways on the opposite sides of the insulation backing, thereby effectuating metallic junction between said pathway patterns.

Yet another object of the invention is to provide a novel method of effectuating homogeneity of metallic junctions between the two pathway patterns on opposite sides of the insulation backing in a printed circuit product of the class aforesaid.

In its fundamental aspects the objects of this invention are attained by first preparing the walls defining the holes aforesaid for reception of the metal to be chemically deposited thereon. Then, the chemical deposition, as for example of metallic copper, is achieved by contacting the thus-prepared walls of the holes with an alkaline solution (the alkalinity being achieved by means of an alkali metal hydroxide) of copper tartrate and alkali metal tartrate in the presence of a reducing agent such as formaldehyde, a homopolymer thereof, glucose, invert sugar, hydrazine, etc. The reducing agent may conveniently be added to the solution of the copper to form a bath in which the article is immersed. The absence of acid radicals other than the tartrate radical in the alkaline solution of copper tartrate and alkali metal tartrate (such as the sulphate ions or radicals, etc.) makes it possible to attain results that otherwise can not be accomplished.

Other and further objects featuring the advantages of the invention will be pointed out herein and set forth in the appended claims forming a part of the invention.

The base or stock material used for making printed circuit products of the type here involved is a laminate of insulation materials with metal foils, generally copper foils, adhered to both sides of the insulation material as set forth in the aforesaid application of Shortt and Langton. Various types of insulation material are suitable for the purpose such as a phenolic material commonly known under the trademark "Bakelite." The copper foil which may have a thickness of 0.00135" is bonded to the insulation material by any adhesive and any method suitable for the purpose. The metal clad insulation material as described is commercially available. Its specific features and the method of producing the same are not essential for the understanding of this invention.

It is advantageous that the metal foils on the opposite sides of the insulation backing be first provided with an electrically non-conductive protective coating. Such coatings protect the metal of the foils from entering into unwanted chemical action with the reagents used in the subsequently defined steps. Many types of commercially available plastics are suitable as coating materials. The vinyl class of plastics has been found to be quite suitable. Metal clad insulation material of the kind here involved is frequently supplied with a strippable plastic coating material known as Frisket to prevent oxidation of the copper foils by exposure to air and corrosion from finger marks during handling and shipping. An undercoating of latex may be provided. Such undercoating facilities the stripping of the plastic coating.

The holes through which the metallic joints are made for interconnecting the pathway patterns that are to be developed from the foils disposed on the opposite sides of the insulation backing may be produced by any suitable means. The selection of the means for producing the holes largely depends upon the number of circuit products to be produced and the number of holes involved. For a small run, the holes may be produced by drilling, but for larger ones, it is more economical to employ a drill template or a die punch with which many thousands of circuit boards or many other circuit products can be prepunched in a relatively short time.

The article with the holes therein is then ready for processing in accordance with this invention. In furtherance of that end, the article with the holes is prepared for the reception of a chemically deposited metal film, for example a copper film, by treatment either mechanically with abrasives or by the action of suitable reagents to provide a relatively rough or porous surface which will absorb various salt solutions. It has been found that satisfactory results, as for example, on phenolic insulation material is attained by circulating through the holes a solution of sodium hydroxide, as for example in a concentration of 100 gms. per liter and at a temperature of approximately 100° F. The solution is circulated through the holes for about 5 minutes. Thereafter, the article is washed with water so as to remove all residual, soluble materials.

The article is then treated for the purpose of enhancing the adherence of the copper to be deposited thereon. For this purpose there is circulated through the holes a solution having the following composition:

2 gms. of titanium dioxide ($TiO_2$) and 12 cc. of concentrated sulphuric acid in 1 liter of water.

Thereafter, following a washing, there is circulated through the holes a second solution of the following composition:

0.2 gm. of palladium chloride and 3 cc. of hydrochloric acid in 1 liter of water.

After such treatment, the article is then immersed in a bath prepared as follows:

(A) A solution made from the following components:

| | Gms. |
|---|---|
| Copper tartrate | 5.3 |
| Rochelle salt (sodium potassium tartrate) | 9.7 |
| Sodium hydroxide | 9.0 |
| Water QS 1 liter. | |

(B) To solution A there is added 200 cc. of formaldehyde (37 percent, N.F.).

Effective deposition of the copper takes place at temperatures in the range of 70°–90° F. The deposit is bright, homogeneous and tenaciously adherent.

The concentration of the tartrates in solution is relatively low. Such concentration may be varied upward and downward, as for example in a range of from one-half to thrice that of the example. The concentration may be selected by the operator in consequence of readily carried out tests which give reduction of the copper solution that proceeds smoothly, and yields depositions of the copper on the wall surface rather than precipitations of the metal in the bath.

It will be understood that the foregoing description of the invention and the examples set forth are merely illustrative of the principles thereof. Accordingly, the appended claims are to be construed as defining the invention within the full spirit and scope thereof.

I claim:

1. In a method of metallically joining the metal layers of two-sidedly metal-clad insulation material of the type used as stock material in the manufacture of printed circuit products, wherein holes are formed through the metal-clad insulation, the step of coating the wall surface defining said holes, which comprises, exposing the said wall surface to the action of an aqueous solution composed of approximately 0.2 gram of palladium chloride and 3 cc. of hydrochloric acid per liter, and then to the action of an aqueous solution composed of 2.65 grams to 15.9 grams of copper tartrate, 4.85 grams to 21.9 grams of Rochelle salt, and 9 grams of sodium hydroxide per liter in the presence of a reducing agent at a temperature in the approximate range of 70°–90° F., whereby the copper is reduced from the soluble state and deposits out as a conductive layer on said wall surface.

2. In a method of metallically joining the metal layers of two-sidedly metal-clad insulation material of the type used as stock material in the manufacture of printed circuit products, wherein holes are formed through the metal-clad insulation, the step of coating the wall surface defining said holes, which comprises, exposing the said wall surface to the action of an aqueous solution composed of approximately 0.2 gram of palladium chloride and 3 cc. of hydrochloric acid per liter, and then to the action of an aqueous solution composed of 5.3 grams of copper tartrate, 9.7 grams of Rochelle salt, and 9 grams of sodium hydroxide per liter in the presence of a reducing agent at a temperature in the approximate range of 70°–90° F., whereby the copper is reduced from the soluble state and deposits out as a conductive layer on said wall surface.

3. In a method of metallically joining the metal layers of two-sidedly metal-clad insulation material of the type used as stock material in the manufacture of printed circuit products, wherein holes are formed through the metal-clad insulation, the step of coating the wall surface defining said holes which comprises exposing the said wall surface to the circulation therethrough of an aqueous solution containing 2.0 grams of titanium dioxide and 12 cc. of concentrated sulfuric acid per liter, washing the same after such treatment, then circulating through the holes an aqueous solution of 0.2 gram of palladium chloride and 3 cc. of hydrochloric acid per liter, and then exposing the said wall surface to an aqueous alkaline solution of 5.3 grams copper tartrate, 9.7 grams of Rochelle salt and 9 grams of sodium hydroxide per liter, in the presence of a reducing agent at a temperature of 70°–90° F. whereby the copper is reduced from the soluble state and deposits out as a conductive layer on said wall surface.

4. Method in accordance with claim 1 wherein the reducing agent is formaldehyde.

5. Method in accordance with claim 2 wherein the reducing agent is formaldehyde.

6. Method in accordance with claim 3 wherein the reducing agent is formaldehyde.

References Cited in the file of this patent

UNITED STATES PATENTS 2,616,994 Luhn ---------- Nov. 4, 1952

OTHER REFERENCES

Babor, Joseph A., and Lehrman, Alexander: General College Chemistry, 2nd edition, p. 507, Thomas Y. Crowell Co., New York, 1940.

The Glass Industry, Marboe and Weyl, "The Chemical Deposition of Copper Mirrors on Glass," vol. 26, No. 3, March 1945, pp. 119, 120, 136–138, 149.

Metallizing Non-Conductors by Sanuel Wein, published by Metal Industry Publishing Co., 11 West 42nd St., New York 18, N.Y., pp. 39–49.